(12) United States Patent
Lee

(10) Patent No.: US 6,967,135 B1
(45) Date of Patent: Nov. 22, 2005

(54) METHOD OF FORMING CAPACITOR OF SEMICONDUCTOR DEVICE

(75) Inventor: Kee Jung Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/000,178

(22) Filed: Nov. 30, 2004

(30) Foreign Application Priority Data

Jun. 30, 2004 (KR) .................... 10-2004-0050065

(51) Int. Cl.$^7$ ........................................ H01L 21/8244
(52) U.S. Cl. ............... 438/239; 438/785; 438/386; 438/393; 438/396; 438/381; 438/243; 438/250; 438/253; 438/3
(58) Field of Search .............. 438/239, 785, 438/386, 393, 396, 381, 243, 250, 253, 3

(56) References Cited

U.S. PATENT DOCUMENTS 5,969,935 A * 10/1999 Kammerdiner et al. ...... 361/311
2002/0079588 A1 * 6/2002 Kim et al. ................... 257/774
2002/0089023 A1 * 7/2002 Yu et al. ...................... 257/411
2003/0137019 A1 * 7/2003 Maria et al. ................. 257/410
2005/0009370 A1 * 1/2005 Ahn et al. ................... 438/785
2005/0124109 A1 * 6/2005 Quevedo-Lopez et al. .. 438/240

* cited by examiner

Primary Examiner—B. William Baumeister
Assistant Examiner—Victor V. Yevsikov
(74) Attorney, Agent, or Firm—Ladas & Parry LLP

(57) ABSTRACT

Disclosed is a method of forming a capacitor of a semiconductor device which can secure a desired leakage current characteristic while securing a desired charging capacitance. The inventive method of forming a capacitor of a semiconductor device comprises steps of: forming a bottom electrode on a semiconductor substrate with a storage node contact so that the bottom electrode is connected with the storage node contact; plasma-nitrifying the bottom electrode to form a first nitrification film on the surface of the bottom electrode; forming a $La_2O_3$ dielectric film on the bottom electrode including the first nitrification film; plasma-nitrifying the $La_2O_3$ dielectric film to form a second nitrification film on the surface of the $La_2O_3$ dielectric film; and forming a top electrode on the $La_2O_3$ dielectric film including the second nitrification film.

27 Claims, 4 Drawing Sheets

METHOD OF FORMING CAPACITOR OF SEMICONDUCTOR DEVICE

BACKGROUND OF THE INVENTION

1. Field of the Invention

The present invention relates to a method of forming a capacitor of a semiconductor device, and more particularly to a method of forming a capacitor of a semiconductor device, which can secure a leakage current characteristic while securing a desired charging capacitance.

2. Description of the Prior Art

Recently, as the high integration of a memory product is accelerated due to the development of semiconductor fabrication technique, a unit cell area is greatly reduced and an operation voltage is lowered. However, despite the reduction of cell area, it is still requested that the charging capacitance required for operating a memory device be sufficiently high and not less than 25 fF/cell to be sufficient for preventing the occurrence of a soft error and the reduction of refresh time.

Accordingly, even though three-dimensional storage electrodes each having an electrode surface of a hemisphere shape have been applied to nitrogen-oxide (NO) capacitors for dynamic random access memories (DRAM's), which employ a $Si_3N_4$ film currently deposited as a dielectric using di-chloro-silane (DCS), the heights of the NO capacitors are continuously increased so as to secure a sufficient capacitance.

As is well known, the charging capacitance of a capacitance is proportional to a surface area of an electrode and a dielectric constant of a dielectric material and reversely proportional to a space between the electrodes, i.e., the thickness of the dielectric.

Meanwhile, the NO capacitors reveal limitations in securing a charging capacitance required for a next generation DRAM of no less than 256 Mbit; accordingly, in order to secure a sufficient charging capacitance, the development of a capacitor employing a dielectric film such as $Al_2O_3$ or $HFO_2$ as a dielectric material is vigorously progressed.

However, because an $Al_2O_3$ dielectric film has a limit in securing a desired charging capacitance because its dielectric constant ($\epsilon=9$) is merely two times of that of $SiO_2$ ($\epsilon\approx4$) and is not so high. Therefore, such an $Al_2O_3$ dielectric film is restrictively applied as a dielectric film of a capacitor in a memory to which a process of metallic wiring with a line width of 100 nm or less is applied.

In addition, although the $HfO_2$ dielectric film has a dielectric constant of about 20 and is more advantageous than the $Al_2O_3$ dielectric film from a standpoint of securing a charging capacitance, the $HFO_2$ dielectric film has a problem in that because its crystallization temperature is lower than that of the $Al_2O_3$ dielectric film, leakage current is abruptly increased when a subsequent high temperature thermal process of 600° C. or more is performed. As a result, it is the current situation that the $HfO_2$ dielectric film is not so easily applied to a memory product.

For this reason, recently, an $HfO_2/Al_2O_3$ capacitor of dual dielectric film structure, an $HfO_2/Al_2O_3/HfO_2$ capacitor of triple dielectric film structure, and etc. have been developed, in which those capacitors are formed by laminating a layer of $Al_2O_3$ film generating a very low leakage current level and one or two layers of $HfO_2$ film having a higher dielectric constant as compared to the $HfO_2$ film.

However, in connection with the fact that the crystallization temperature is lower than that of the $Al_2O_3$, if a high temperature thermal process of 750° C. or more is performed when a top electrode is formed from doped polysilicon, or if a high temperature thermal process of 600° C. or more is performed when the top electrode is formed from a metallic material such as TiN, a problem still arises in that the $HfO_2$ dielectric film is crystallized and impurity is diffused into the dielectric film from the top electrode, thereby increasing the leakage current. Here, in the case in which the top electrode is formed from doped polysilicon, the impurity is Si or dopants, while in the case in which the upper is formed from TiN induced by $TiCl_4$, the impurity is Cl ions.

Consequently, at present, each of the $Al_2O_3$ and $HFO_2$ films is substantially difficult to employ as a dielectric film capable of securing a desired leakage current characteristic while securing a desired charging capacitance.

SUMMARY OF THE INVENTION

Accordingly, the present invention has been made to solve the above-mentioned problems occurring in the prior art, and an object of the present invention is to provide a method of forming a capacitor of a semiconductor device which enables the sufficient endurance of the capacitor to be obtained while securing a desired charging capacitance.

In order to achieve the above-mentioned object, there is provided a method of forming a capacitor of a semiconductor device comprising steps of: forming a bottom electrode on a semiconductor substrate with a storage node contact so that the bottom electrode is connected with the storage node contact; plasma-nitrifying the bottom electrode to form a first nitrification film on the surface of the bottom electrode; forming a $La_2O_3$ dielectric film on the bottom electrode including the first nitrification film; plasma-nitrifying the $La_2O_3$ dielectric film to form a second nitrification film on the surface of the $La_2O_3$ dielectric film; and forming a top electrode on the $La_2O_3$ dielectric film including the second nitrification film.

According to the present invention, there is also provided a method of forming a capacitor of a semiconductor device comprising steps of: forming a bottom electrode on a semiconductor substrate with a storage node contact so that the bottom electrode is connected with the storage node contact; plasma-nitrifying the bottom electrode to form a first nitrification film on the surface of the bottom electrode; depositing in sequence an $Al_2O_3$ film and a $La_2O_3$ dielectric film on the bottom electrode including the first nitrification film to form a dual dielectric film structure of $Al_2O_3/La_2O_3$; plasma-nitrifying the dual dielectric film structure of $Al_2O_3/La_2O_3$ to form a second nitrification film on the surface of the $La_2O_3$ dielectric film; and forming a top electrode on the dual dielectric film structure of $Al_2O_3/La_2O_3$ including the second nitrification film.

In addition, the present invention provides a method of forming a capacitor of a semiconductor device comprising steps of: forming a bottom electrode on a semiconductor substrate with a storage node contact so that the bottom electrode is connected with the storage node contact; plasma-nitrifying the bottom electrode to form a first nitrification film on the surface of the bottom electrode; depositing in sequence a bottom $La_2O_3$ film, an $Al_2O_3$ film and a top $La_2O_3$ dielectric film on the bottom electrode including the first nitrification film to form a triple dielectric film structure of $La_2O_3/Al_2O_3/La_2O_3$; plasma-nitrifying the triple dielectric film structure of $La_2O_3/Al_2O_3/La_2O_3$ to form a second nitrification film on the surface of the $La_2O_3$ dielectric film; and forming a top electrode on the triple dielectric film structure of $La_2O_3/Al_2O_3/La_2O_3$ including the second nitrification film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Referring to the technical principle of the present invention, the present invention forms a capacitor by applying a nitrified $La_2O_3$ dielectric film as a dielectric film so as to overcome the limit in dielectric properties of an $Al_2O_3$ film as well as the limit in thermal stability of an $HfO_2$ film. In addition, in forming the nitrified $La_2O_3$ film, La—O—N bond is induced by introducing nitrogen into the $La_2O_3$ film through low-temperature plasma nitrification implemented on the surface of the $La_2O_3$ film under the $NH_3$ gas atmosphere after the $La_2O_3$ film is deposited.

In this event, due to the nitrification of the surface of the $La_2O_3$ film, the crystallization temperature of the $La_2O_3$ film itself is increased and the diffusion of impurity into the $La_2O_3$ film from a bottom electrode and a top electrode is also prevented.

Therefore, the inventive capacitor employing a nitrified $La_2O_3$ dielectric film can secure a desired charging capacitance due to the fact that the $La_2O_3$ dielectric film has a dielectric constant of about 30. In addition, because the crystallization temperature of the $La_2O_3$ itself is increased and the diffusion of impurity into the film is blocked, the inventive capacitor can also reduce the leakage current level and improve the breakdown voltage characteristic, even if a high-temperature thermal process, which has been inevitably performed after forming the $La_2O_3$ dielectric film due to a characteristic of the semiconductor fabrication process, is performed.

Consequently, the present invention can stably apply a $La_2O_3$ dielectric film to the capacitor of an ultra-highly integrated product of 256 Mbit or more, to which a 100 nm or more metallic wiring process is applied. In addition, the present invention can also apply a dual dielectric film structure of $Al_2O_3/La_2O_3$ or a triple dielectric film structure of $La_2O_3/Al_2O_3/La_2O_3$ to a capacitor of the ultra-high integrated product, beyond a single dielectric film structure of $La_2O_3$.

In addition, the present invention can also increase a life span of a capacitor as well as provide a capacitor which has a good electric characteristic even if a high-temperature thermal process of 500° C. or more is applied.

Hereinafter, a method of forming a capacitor according to a preferred embodiment of the present invention is described with reference to FIGS. 1 to 5. Here, FIGS. 1 to 3 are cross-sectional views showing a capacitor forming process, FIGS. 4A to 4D are drawings for describing plasma nitrification according to the present invention, and FIG. 5 is a schematic view for describing a method of depositing a $La_2O_3$ film using ALD or pulsed-CVD.

Figure 1:
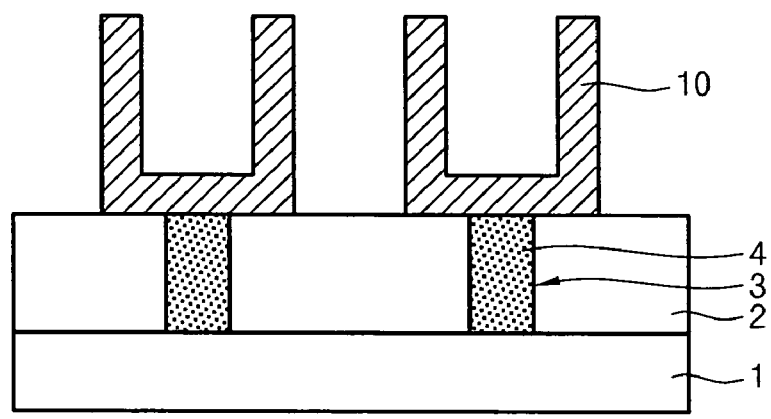
FIGS. 1 to 3 are cross-sectional views showing a process of forming capacitors according to an embodiment of the present invention.

Referring to FIG. 1, an interlayer dielectric film 2 is formed on the entire surface of a semiconductor substrate 1, which is formed with a bottom pattern (not shown) including transistors and bit lines, to cover the bottom pattern. Then, the interlayer dielectric film 2 is etched to form at least one contact hole for exposing a substrate junction area or landing plug poly (LPP) and then a conductive film is embedded in the contact hole to form a storage node contact 3. Next, a charge storage electrode, i.e., a bottom electrode 10 is formed to be connected to the storage node contact 3.

Here, the bottom electrode 10 is formed of doped polysilicon or a metallic material selected from a group consisting of TiN, TaN, W, WN, WSi, Ru, $RuO_2$, Ir, $IrO_2$ or PT. In addition, although the drawing shows the bottom electrode 10 formed in a cylindrical structure, the electrode 10 may be formed in a simple plate structure or a concave structure. In addition, in the case in which the bottom electrode 10 is formed doped from polysilicon, it is possible to form hemisphere grains on the surfaces of the bottom electrodes 10 in order to secure a larger charging capacitance.

Figure 2:
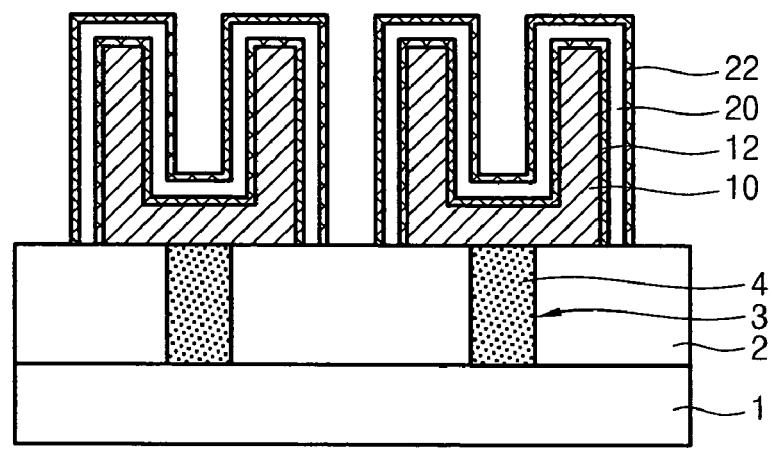
Figure 3:
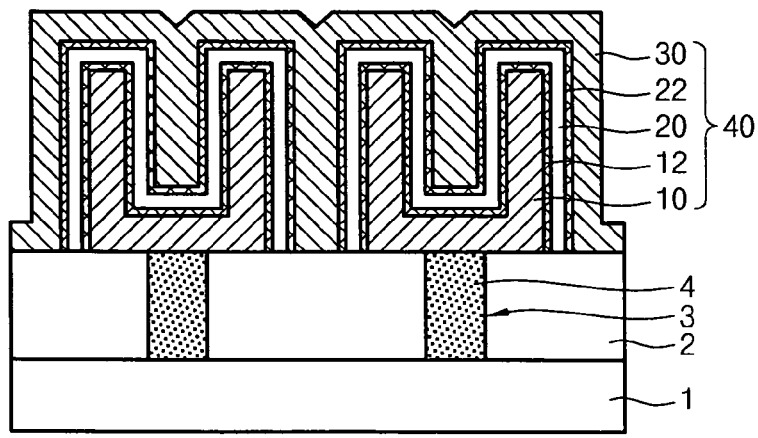

Referring to FIG. 2, the surface of the bottom electrode 10 is plasma-nitrified and thus a first nitrified film 12 is formed on the surfaces. Thereafter, a $La_2O_3$ film is deposited on the first nitrified film 12 and then plasma-nitrified, so that a $La_2O_3$ dielectric film 20 having second nitrified films 22 on the surface thereof as a dielectric material is formed.

At this time, the plasma nitrification is performed in order to strengthen the heat resistance of the La2O3 dielectric film 20 and to prevent impurity from penetrating into the film 20, wherein the plasma nitrification is performed for 5 to 300 seconds in a chamber, within which glow discharge has been generated with a RF power of about 100 to 500 W under an atmosphere of $NH_3$, $N_2$ or $N_2/H_2$, of which the temperature is 200 to 500° C. and the pressure is 0.1 to 10 torr.

Figure 4A:
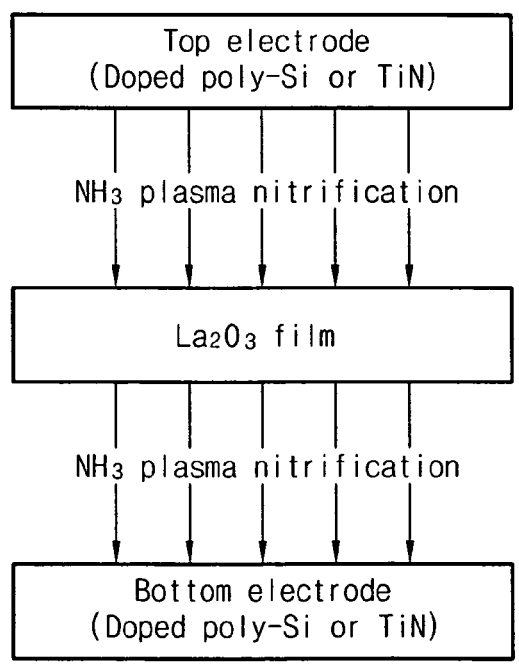
FIGS. 4A to 4D are drawings for describing plasma nitrification according to the present invention.
Figure 5:
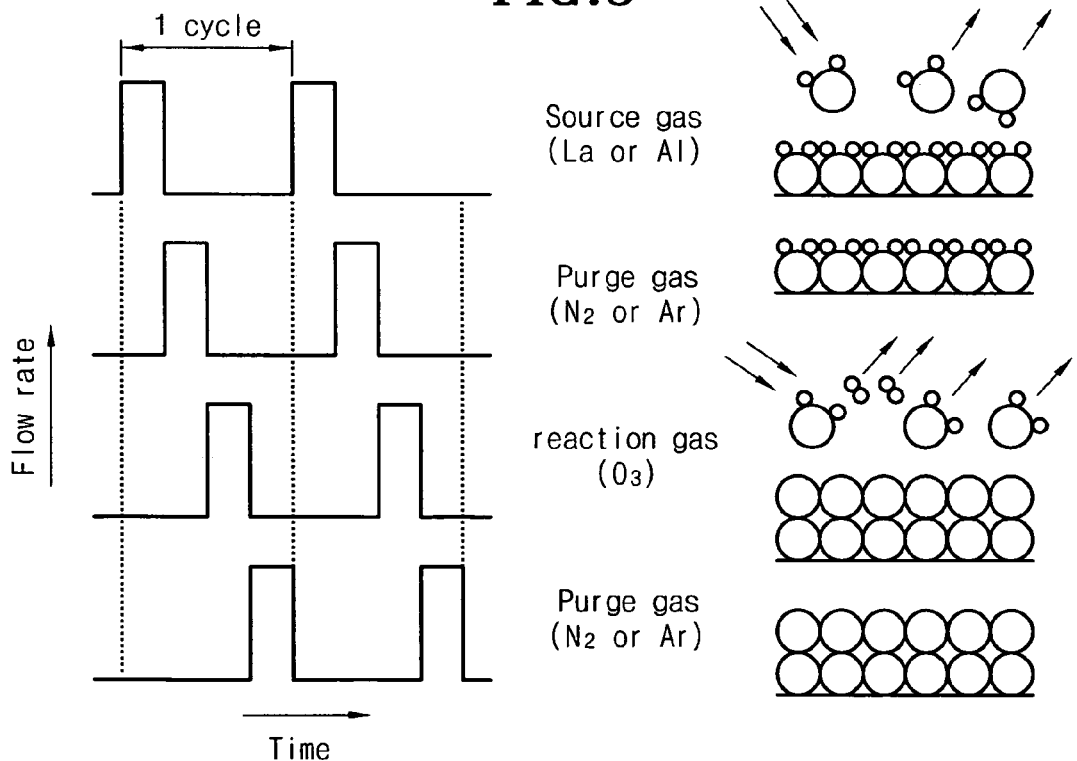
FIG. 5 is a drawing for describing a method of depositing a $La_2O_3$ film using ALD or pulsed-CVD.

FIG. 4A is a schematic view showing the plasma nitrification in forming a $La_2O_3$ dielectric film on a bottom electrode, in which the plasma nitrification is performed before and after the deposition of the $La_2O_3$ film as can be seen from the drawing.

It is also possible to form the dielectric film in a dual dielectric film structure of $Al_2O_3/La_2O_3$ or in a triple dielectric film structure of $La_2O_3/Al_2O_3/La_2O_3$ rather than in a single film structure of $La_2O_3$.

Figure 4B:
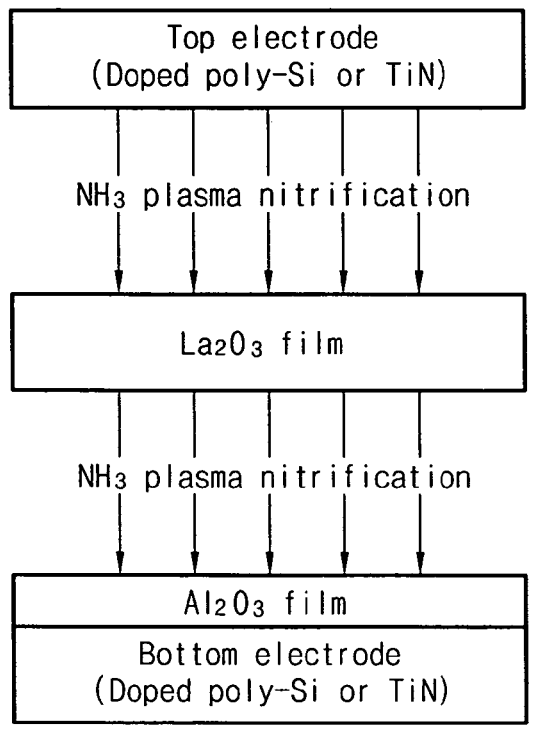
Figure 4C:
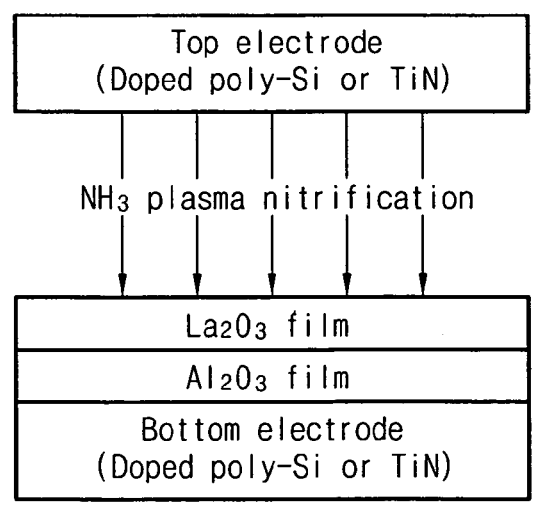
Figure 4D:
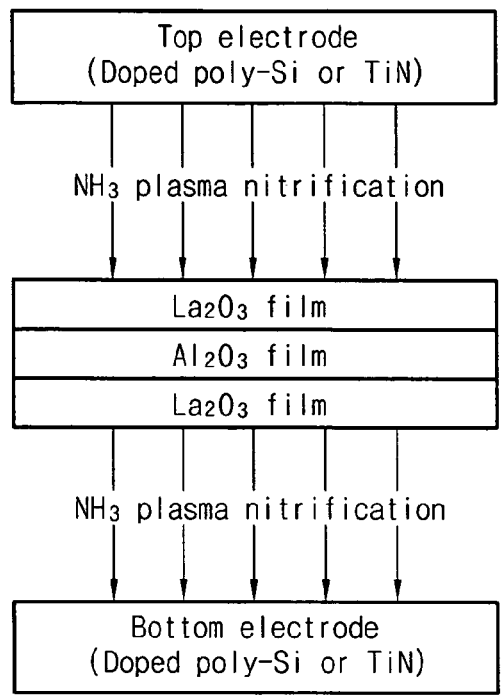

In the case in which the capacitor is formed in the dual dielectric structure of $Al_2O_3/La_2O_3$, if the surface of the $Al_2O_3$ film is plasma-nitrified before and after the deposition of the $La_2O_3$ film to form a capacitor as shown in FIG. 4B, the diffusion of impurity from the top electrode, which is the source of leakage current, is firstly blocked, and because La—O—N bond is induced on the top and bottom surfaces of the $La_2O_3$ film and the crystallization temperature of the $La_2O_3$ film itself is increased, crystallization is suppressed when a subsequent high temperature thermal process of 600° C. or more is performed, whereby the occurrence of leakage current from the capacitor can be prevented and the breakdown voltage of the dielectric film of the capacitor can be increased.

Whereas, since the $Al_2O_3$ film is relatively superior to the $La_2O_3$ film in terms of thermal stability, the plasma nitrification of the surface of the $Al_2O_3$ film before the formation of the $La_2O_3$ film can be omitted. In other words, it is possible to expect a sufficient effect of strengthening the heat resistance of the $La_2O_3$ by performing the plasma nitrification only after the formation of the $La_2O_3$ film.

In the case in which the dielectric film is formed in the triple dielectric structure of $La_2O_3/Al_2O_3/La_2O_3$, it is preferable to perform the plasma nitrification before and after the deposition of the bottom $La_2O_3$ and before and after the deposition of top $La_2O_3$ films. However, it is also preferable to selectively perform the plasma nitrification only before the formation of the bottom $La_2O_3$ film and after the top $La_2O_3$ film in terms of productivity.

In addition, after the plasma nitrification, the electric characteristic of the capacitor can be varied because nitrogen is piled-up on the surface of the $La_2O_3$ dielectric surface 20 or the $Al_2O_3$ film. Therefore, there is a need for controlling the profile of concentration of the piled-up nitrogen, annealing is performed according to RTP or furnace treatment in a normal or decompressed state and in the range of 600 to 900° C. after the plasma nitrification, to selectively thermally diffuse the nitrogen.

Meanwhile, in forming the $La_2O_3$ dielectric film 20, the deposition of the $La_2O_3$ film including the $Al_2O_3$ film is performed using an ALD or MOCVD process or a modified pulsed-CVD process. At this time, if the electric film is formed in a single $La_2O_3$ dielectric film structure, the $La_2O_3$ film is deposited in a thickness of 50 to 150 Å, and if the electric film is formed in a dual dielectric film structure of $Al_2O_3/La_2O_3$ or a triple dielectric film structure, the bottom $La_2O_3$ film, the $Al_2O_3$ film, and the top $La_2O_3$ film are deposited in the thicknesses of 10 to 100 Å, 5 to 25 Å, and 10 to 100 Å, respectively.

At the time of depositing the $La_2O_3$ film, $La(CH_3)_3$ or $La(iPr-AMD)_3$ may used as a source gas of La component, or other organic metal compounds, such as $La(C_2H_5)_3$, containing La may be used as a precursor of the source gas, and $O_3$ (concentration: 200±50 g/m³, 100 to 1000 cc), $O_2$ (100 to 1000 cc) or $H_2O$ vapor (100 to 1000 cc) may be used as a reaction gas. In addition, when depositing the $Al_2O_3$ film, $Al(CH_3)_3$ may be used as a source gas of Al component or other organic metal compounds, such as $Al(C_2H_5)_3$, containing Al may be used as a precursor of the source gas, and $O_3$ (concentration: 200±20 g/m³, 100 to 1000 cc) or $O_2$ (100 to 1000 cc) may be used or $H_2O$ vapor (100 to 1000 cc) may be used as a reaction gas.

The deposition of the $La_2O_3$ film or the $Al_2O_3$ film using ALD or pulsed-CVD is performed in such a manner of repeating a deposition cycle, in which source gas flowing step, purging step, reaction gas flowing step, and purging step are performed in this order, until a desired thickness of film is obtained.

Referring to FIG. 3, by forming as a plate electrode, i.e., a top electrode 30 on the $La_2O_3$ dielectric film 20, of which the surface has been formed with the second nitrification film 22 according to a well-known process, the inventive capacitor 40 is completed. Thereafter, a silicon nitrification film or a doped polysilicon film is deposited on the resultant substrate including the top electrode 30 to a thickness of about 200 to 1000 Å, thereby forming a protection film 50 so as to increase the structural stability of the capacitor 40 against humidity, temperature or electric impact.

Here, the top electrode 30 is formed from doped polysilicon or a metallic material selected from the group consisting of TiN, TaN, W, WSi, Ru, $RuO_2$, Ir, $IrO_2$ and Pt, like the bottom electrode 10.

As described above, according to the present invention, by applying a $La_2O_3$ dielectric film, in which La—O—N bond has been induced by plasma-nitrifying $La_2O_3$ film at low-temperature to introduce nitrogen into the $La_2O_3$ film, as a capacitor dielectric, it is possible to increase the crystallization temperature of the $La_2O_3$ dielectric film and prevent the diffusion of impurity from the top and bottom electrodes, whereby the leakage current characteristic and the breakdown voltage characteristic can be enhanced while securing a desired charging capacitance.

Therefore, according to the present invention, it is possible to reduce the leakage current level generated by a high-temperature thermal process of 700° C. or more by at least two times as compared that caused in the prior art even if a dual dielectric film structure of $Al_2O_3/La_2O_3$ or a triple dielectric film of $La_2O_3/Al_2O_3/La_2O_3$ is employed beyond a single dielectric film structure of $La_2O_3$ so as to form a capacitor, whereby the endurance and reliability of a capacitor can be enhanced in an ultra-high integrated memory product.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of forming a capacitor of a semiconductor device comprising steps of:
    forming a bottom electrode on a semiconductor substrate with a storage node contact so that the bottom electrode is connected with the storage node contact;
    plasma-nitrifying the bottom electrode to form a first nitrification film on the surface of the bottom electrode;
    forming a $La_2O_3$ dielectric film on the bottom electrode including the first nitrification film;
    plasma-nitrifying the $La_2O_3$ dielectric film to form a second nitrification film on the surface of the $La_2O_3$ dielectric film; and
    forming a top electrode on the $La_2O_3$ dielectric film including the second nitrification film.

2. A method as claimed in claim 1, wherein the bottom electrode and the top electrode are formed from doped polysilicon or a metal selected from a group consisting of TiN, TaN, W, WN, WSi, Ru, $RuO_2$, Ir, $IrO_2$ and Pt.

3. A method as claimed in claim 1, wherein the plasma-nitrification is performed for 5 to 300 sec within a chamber where glow discharge is generated with RF power tuned to about 100 to 500 W, at a temperature of 200 to 500° C., at a pressure about 0.1 to 10 torr and under an atmosphere selected from a group consisting of $NH_3$, $N_2$ and $N_2/H_3$.

4. A method as claimed in claim 1 or claim 3, wherein after the plasma nitrification, wherein the present invention further comprises step of performing RTP or furnace annealing at a normal or decompressed state and at a temperature in the range of 600 to 900° C., so that nitrogen piled-up on the surface of the $La_2O_3$ dielectric film is diffused.

5. A method as claimed in claim 1, wherein the $La_2O_3$ dielectric film is formed by deposition using any one selected from a group consisting of ALD, MOCVD, and modified pulsed-CVD.

6. A method as claimed in claim 5, wherein the $La_2O_3$ dielectric film is deposited to a thickness of about 50 to 150 Å.

7. A method as claimed in claim 5, wherein the deposition of the $La_2O_3$ film is performed by using any one selected from a group consisting of $La(CH_3)_3$, $La(iPr-AMD)_3$, $La(C_2H_5)_3$ and other organic metal compounds containing La as a source gas, and using any one selected from $O_3$, $O_2$ and $H_2O$ vapor as a reaction gas.

8. A method as claimed in claim 1, wherein after the step of forming the top electrode, the method further comprises step of forming a protection film consisting of a silicon nitride film or doped polysilicon in a thickness of about 200 to 1000 Å.

9. A method of forming a capacitor of a semiconductor device comprising steps of:
   forming a bottom electrode on a semiconductor substrate with a storage node contact so that the bottom electrode is connected with the storage node contact;
   plasma-nitrifying the bottom electrode to form a first nitrification film on the surface of the bottom electrode;
   depositing in sequence an $Al_2O_3$ film and a $La_2O_3$ dielectric film on the bottom electrode including the first nitrification film to form a dual dielectric film structure of $Al_2O_3/La_2O_3$;
   plasma-nitrifying the dual dielectric film structure of $Al_2O_3/La_2O_3$ to form a second nitrification film on the surface of the $La_2O_3$ dielectric film; and
   forming a top electrode on the dual dielectric film structure of $Al_2O_3/La_2O_3$ including the second nitrification film.

10. A method as claimed in claim 9, wherein the bottom electrode and the top electrode are formed from doped polysilicon or a metal selected from a group consisting of TiN, TaN, W, WN, WSi, Ru, $RuO_2$, Ir, $IrO_2$ and Pt.

11. A method as claimed in claim 9, wherein the plasma-nitrification is performed for 5 to 300 sec within a chamber where glow discharge is generated with RF power tuned to about 100 to 500 W, at a temperature of 200 to 500° C., at a pressure about 0.1 to 10 torr and under an atmosphere selected from a group consisting of $NH_3$, $N_2$ and $N_2/H_3$.

12. A method as claimed in claim 9, wherein after the deposition of the $Al_2O_3$ film and before the deposition of the $La_2O_3$ film, the method further comprises step of plasma-nitrifying the $Al_2O_3$ film.

13. A method as claimed in claim 9 or claim 12, wherein after the plasma nitrification, the method further comprises step of performing RTP or furnace annealing at a normal or decompressed state and at a temperature in the range of 600 to 900° C., so that nitrogen piled-up on the surface is diffused.

14. A method as claimed in claim 9, wherein the $Al_2O_3$ film and the $La_2O_3$ film are formed by deposition using any one selected from a group consisting of ALD, MOCVD, and modified pulsed-CVD.

15. A method as claimed in claim 14, wherein the $Al_2O_3$ film is deposited to a thickness of 5 to 25 Å and the $La_2O_3$ dielectric film is deposited to a thickness of about 10 to 100 Å.

16. A method as claimed in claim 14, wherein the deposition of the $Al_2O_3$ film and the $La_2O_3$ film is performed by using any one selected from a group consisting of $La(CH_3)_3$, $La(iPr-AMD)_3$, $La(C_2H_5)_3$ and other organic metal compounds containing La as a source gas of La component, using any one selected from a group consisting of $Al(CH_3)_3$, $Al(C_2H_5)_3$ and other organic metal compounds containing Al as a source gas of La component, and using any one selected from $O_3$, $O_2$ and $H_2O$ vapor as a reaction gas.

17. A method as claimed in claim 9, wherein after the step of forming the top electrode, the method further comprises step of forming a protection film consisting of a silicon nitride film or doped polysilicon in a thickness of about 200 to 1000 Å.

18. A method of forming a capacitor of a semiconductor device comprising steps of:
   forming a bottom electrode on a semiconductor substrate with a storage node contact so that the bottom electrode is connected with the storage node contact;
   plasma-nitrifying the bottom electrode to form a first nitrification film on the surface of the bottom electrode;
   depositing in sequence a bottom $La_2O_3$ film, an $Al_2O_3$ film and a top $La_2O_3$ dielectric film on the bottom electrode including the first nitrification film to form a triple dielectric film structure of $La_2O_3/Al_2O_3/La_2O_3$;
   plasma-nitrifying the triple dielectric film structure of $La_2O_3/Al_2O_3/La_2O_3$ to form a second nitrification film on the surface of the $La_2O_3$ dielectric film; and
   forming a top electrode on the triple dielectric film structure of $La_2O_3/Al_2O_3/La_2O_3$ including the second nitrification film.

19. A method as claimed in claim 18, wherein the bottom electrode and the top electrode are formed from doped polysilicon or a metal selected from a group consisting of TiN, TaN, W, WN, WSi, Ru, $RuO_2$, Ir, $IrO_2$ and Pt.

20. A method as claimed in claim 18, wherein the plasma-nitrification is performed for 5 to 300 sec within a chamber where glow discharge is generated with RF power tuned to about 100 to 500 W, at a temperature of 200 to 500° C., at a pressure about 0.1 to 10 torr and under an atmosphere selected from a group consisting of $NH_3$, $N_2$ and $N_2/H_3$.

21. A method as claimed in claim 18, wherein the method further comprises steps of plasma-nitrifying the surface of the bottom $La_2O_3$ film after the deposition of the bottom $La_2O_3$ film, and plasma-nitrifying the surface of the $Al_2O_3$ film after the deposition of the $Al_2O_3$ film.

22. A method as claimed in claim 18, wherein after the deposition of the bottom $La_2O_3$, the method further comprises step of plasma-nitrifying the surface of the bottom $La_2O_3$.

23. A method as claimed in claim 18 or claim 21, wherein after the plasma nitrification, the method further comprises step of performing RTP or furnace annealing at a normal or decompressed state and at a temperature in the range of 600 to 900° C., so that nitrogen piled-up on the surface is diffused.

24. A method as claimed in claim 18, wherein the bottom $La_2O_3$ film, the $Al_2O_3$ film and the top $La_2O_3$ film are formed by deposition using any one selected from a group consisting of ALD, MOCVD, and modified pulsed-CVD.

25. A method as claimed in claim 24, wherein the bottom $La_2O_3$ film is deposited to a thickness of 10 to 100 Å, the $Al_2O_3$ film is deposited to a thickness of 5 to 25 Å and the top $La_2O_3$ dielectric film is deposited to a thickness of about 10 to 100 Å.

26. A method as claimed in claim 24, wherein the deposition of the bottom $La_2O_3$ film, the $Al_2O_3$ film and the top $La_2O_3$ film is performed by using any one selected from a group consisting of $La(CH_3)_3$, $La(iPr-AMD)_3$, $La(C_2H_5)_3$ and other organic metal compounds containing La as a source gas of La component, using any one selected from a group consisting of $Al(CH_3)_3$, $Al(C_2H_5)_3$ and other organic metal compounds containing Al as a source gas of La component, and using any one selected from $O_3$, $O_2$ and $H_2O$ vapor as a reaction gas.

27. A method as claimed in claim 18, wherein after the step of forming the top electrode, the method further comprising step of forming a protection film consisting of a silicon nitride film or doped polysilicon in a thickness of about 200 to 1000 Å.

* * * * *

UNITED STATES PATENT AND TRADEMARK OFFICE
CERTIFICATE OF CORRECTION

PATENT NO. : 6,967,135 B1
DATED : November 22, 2005
INVENTOR(S) : Kee Jeung Lee

It is certified that error appears in the above-identified patent and that said Letters Patent is hereby corrected as shown below:

<u>Title page,</u>
Item [75], Inventors, delete "Jung" and insert -- Jeung --.

Signed and Sealed this

Fourth Day of April, 2006

JON W. DUDAS
*Director of the United States Patent and Trademark Office*